US006764809B2

(12) United States Patent
DeSimone et al.

(10) Patent No.: US 6,764,809 B2
(45) Date of Patent: Jul. 20, 2004

(54) CO₂-PROCESSES PHOTORESISTS, POLYMERS, AND PHOTOACTIVE COMPOUNDS FOR MICROLITHOGRAPHY

(75) Inventors: Joseph M. DeSimone, Chapel Hill, NC (US); Ruben G. Carbonell, Raleigh, NC (US); Jonathan Kendall, Apex, NC (US); Christopher L. McAdams, Chapel Hill, NC (US)

(73) Assignees: North Carolina State University, Raleigh, NC (US); University of North Carolina at Chapel Hill, Chapel Hill, NC (US)

( * ) Notice: Subject to any disclaimer, the term of this patent is extended or adjusted under 35 U.S.C. 154(b) by 126 days.

(21) Appl. No.: 09/975,211

(22) Filed: Oct. 10, 2001

(65) Prior Publication Data

US 2002/0119398 A1 Aug. 29, 2002

Related U.S. Application Data

(60) Provisional application No. 60/267,993, filed on Feb. 9, 2001, and provisional application No. 60/239,749, filed on Oct. 12, 2000.

(51) Int. Cl.⁷ .............................. C03F 7/00; C08J 7/00
(52) U.S. Cl. ....................... 430/313; 430/311; 430/314; 430/322; 430/323; 430/324; 430/925; 427/489; 427/490; 216/62
(58) Field of Search ......................... 430/311, 313, 430/314, 322, 323, 324, 925; 427/489, 490; 216/62

(56) References Cited

U.S. PATENT DOCUMENTS

| | | | |
|---|---|---|---|
| 3,858,304 A | * | 1/1975 | Leedy et al. ................. 438/533 |
| 4,636,440 A | | 1/1987 | Jada ............................ 428/446 |
| 4,749,631 A | | 6/1988 | Haluska et al. ............. 428/704 |

(List continued on next page.)

FOREIGN PATENT DOCUMENTS

| | | |
|---|---|---|
| EP | 0 775 669 A2 | 5/1997 |
| EP | 0 869 515 A1 | 7/1998 |
| EP | 0 869 516 A1 | 7/1998 |
| WO | WO 98/46526 | 10/1998 |
| WO | WO 98/47177 | 10/1998 |
| WO | WO 98/49721 | 11/1998 |
| WO | WO 00/67072 | 11/2000 |

OTHER PUBLICATIONS

Bae et al., "Imageable Polymers Using Fluorocarbinol Containing Polydienes", *Polymer Preprints*, 41(2), 1586–1587, (2000).

Gabor et al., "Block and Random Copolymer Resists Designed for 193 nm Lithography and Environmentally Friendly Supercritical CO₂ Delevelopment", *SPIE*, 2724, 410–417, (1996).

(List continued on next page.)

*Primary Examiner*—Nicole Barreca
(74) *Attorney, Agent, or Firm*—Myers Bigel Sibley & Sajovec, PA (57) ABSTRACT

A process of forming a resist image in a microelectronic substrate comprises the steps of contacting the substrate with a composition first comprising carbon dioxide and a component selected from the group consisting of at least one polymeric precursor, at least one monomer, at least one polymeric material, and mixtures thereof to deposit the component on the substrate and form a coating thereon; then imagewise exposing the coating to radiation such that exposed and unexposed coating portions are formed; then subjecting the coating to a second composition comprising carbon dioxide having such that either one of the exposed or the unexposed coating portions are removed from the substrate and the other coating portion is developed and remains on the coating to form an image thereon.

67 Claims, 2 Drawing Sheets

U.S. PATENT DOCUMENTS

| | | | | |
|---|---|---|---|---|
| 4,756,977 | A | | 7/1988 | Haluska et al. ............ 428/704 |
| 4,842,888 | A | | 6/1989 | Haluska et al. .............. 427/38 |
| 4,847,162 | A | | 7/1989 | Haluska et al. ............ 428/457 |
| 5,116,637 | A | | 5/1992 | Baney et al. ............... 427/340 |
| 5,262,201 | A | | 11/1993 | Chandra et al. ......... 427/376.2 |
| 5,468,595 | A | * | 11/1995 | Livesay ..................... 430/296 |
| 5,523,163 | A | | 6/1996 | Ballance et al. ........... 428/446 |
| 5,547,703 | A | | 8/1996 | Camilletti et al. ....... 427/126.3 |
| 5,618,878 | A | | 4/1997 | Syktich et al. ............. 524/588 |
| 5,665,527 | A | | 9/1997 | Allen et al. ................. 430/325 |
| 5,733,714 | A | * | 3/1998 | McCulloch et al. ........ 430/325 |
| 5,739,223 | A | | 4/1998 | DeSimone ................... 526/89 |
| 5,753,305 | A | | 5/1998 | Smith et al. ............... 427/335 |
| 6,001,418 | A | | 12/1999 | DeSimone et al. ......... 427/240 |
| 6,024,801 | A | | 2/2000 | Wallace et al. ................ 134/1 |
| 6,045,877 | A | | 4/2000 | Gleason et al. ............ 427/522 |
| 6,074,695 | A | | 6/2000 | Kobayashi et al. ........ 427/245 |
| 6,165,559 | A | | 12/2000 | McClain et al. ......... 427/388.1 |
| 6,231,989 | B1 | | 5/2001 | Chung et al. .............. 428/447 |
| 6,265,129 | B1 | * | 7/2001 | Takahashi et al. ......... 430/192 |

OTHER PUBLICATIONS

Glaser et al., "Effect of the $H_2O$/TEOS Ratio Upon The Preparation and Nitridation of Silica SOL/GEL Films", *Journal of Non–Crystalline Solids*, 63, 209–221, (1984).

Hoggan et al., "Spin Coating and Photolithography Using Liquid and Supercritical Carbon Dioxide", *Polymeric Materials and Science Engineering*—Fall Meeting, New Orleans, Louisiana, 81, 47–48, (1999).

Meerholz et al., "Stability Improvements of High–Performance Photorefractive Polymers Containing Eutectic Mixtures of Electro–optic Chromophores**", *Adv. Matr.*, 9(13), 1043, (1997).

Ober et al., "Imaging Polymers with Supercritical Carbon Dioxide**", *Adv. Mater.*, 9(13), 1039–1042, (1997).

Sundararajan et al., "Supercritical $CO_2$ Processing for Submicron Imaging of Fluropolymers", *Chem. Mater.*, A–H, (1999).

Weibel et al., "Patternable Low–K–Dieletrics Developed Using Supercritical $CO_2$", *Polymer Preprints*, 41(2), 1838, (2000).

Yang et al., "Low–Surface–Energy Fluoromethacrylate Block Copolymers with Patternable Elements", *Chem. Matr.*, 12(1), 33–40, (2000).

Yu et al., "Microfabrication of Hydrogels as Polymer Scaffolds for Tissue Engineering Applications", *Polymer Preprints*, 41(2), 1699–1700, (2000).

International Search Report for PCT/US01/31504 dated Nov. 30, 2001.

* cited by examiner

CO₂-PROCESSES PHOTORESISTS, POLYMERS, AND PHOTOACTIVE COMPOUNDS FOR MICROLITHOGRAPHY

CROSS-REFERENCE TO RELATED APPLICATIONS

The present application claims priority to Provisional Application Nos. 60/239,749, filed Oct. 12, 2000 and 60/267,993 filed Feb. 9, 2001, the disclosures of which are incorporated herein by reference in their entirety.

FIELD OF THE INVENTION

The invention generally relates to processes relating to forming microelectronic devices using carbon dioxide.

Background of the Invention

There are a number of lithography processes which are well known in the art used in conjunction with manufacturing microelectronic devices. A typical lithography process involves aligning and transferring a pattern from a template using optics onto a partially processed substrate (e.g., wafer) that has been coated with a photoresist. The resist is then developed and the resist image is thereafter transferred into the underlying material typically by a chemical and/or thermal step such as, for example, dry/wet etch, sinter, implant, etc. This process is often repeated many times (e.g., between 15 to 20) during the course of building a complex integrated circuit.

The above processing steps can result in distortions being present in the wafer. Thus, wafer handling during processing is extremely important. The wafer handling subsystem is believed to be largely responsible for the throughput of the processing tool. Accordingly, the wafer handling should be designed to minimize sources of possible contamination. A difficulty from a processing standpoint relates to the incompatibility of an organic or aqueous solvent based coating solution and the enclosed equipment (e.g., a vacuum environment) used for processing substrates that have developed photo resist images (positive or negative) formed therein.

U.S. Pat. No. 5,665,527 to Allen et al. proposes a process for generating a negative tone resist image comprising the steps of coating a substrate with a film of a polymeric composition comprising a polymer, a photosensitive acid generator, and acid labile groups, imagewise exposing the film to radiation to generate free acid, and developing the image with critical fluid, e.g., carbon dioxide.

Notwithstanding the above, there is a need in the art for processes for forming semiconductor devices that involve depositing, developing and stripping resists that may be carried out in an integrated closed system which uses a solvent which is relatively benign from an environmental perspective (e.g., carbon dioxide). Such a process would be highly advantageous in that it would reduce or obviate the repeated entry, removal, and re-entry steps that are inherent in non-integrated processes.

SUMMARY OF THE INVENTION

In one aspect, the invention provides a process of forming a resist image in a microelectronic substrate. The process comprises the steps of contacting the substrate with a first composition comprising carbon dioxide and a component selected from the group consisting of at least one polymeric material, at least one monomer, at least one polymeric precursor, and mixtures thereof to deposit the component on the substrate and form a coating thereon, then imagewise exposing the coating to radiation such that exposed and unexposed coating portions are formed, and then subjecting the coating to a second composition comprising carbon dioxide such that either one of the exposed or the unexposed coating portions are removed from the substrate and the other coating portion remains on the coating to form an image thereon (e.g., developing the image using carbon dioxide). For the purposes of the invention, the first and second compositions may be the same or different. In a preferred embodiment, each step may be performed in a closed system such that said process is an integrated process. For the purposes of the invention, the term "closed system" refers to a system that is not exposed to ambient conditions.

This and other aspects are described by the invention in greater detail herein.

BRIEF DESCRIPTION OF THE DRAWING FIGURES

The invention can be more readily ascertained from the following description of the invention when read in conjunction with the accompanying drawings in which.

DETAILED DESCRIPTION OF THE PREFERRED EMBODIMENTS

The invention will now be described in greater detail in reference to its preferred embodiments described in the text below and in the drawings. It should be understood that these embodiments are for illustrative purposes only, and do not limit the scope of the invention as defined by the claims.

Stated alternatively, the invention encompasses a method of forming a patterned resist layer on a substrate comprising the steps of forming on the substrate a resist layer comprising a material selected from the group consisting of at least one polymeric material, at least one monomer, at least one polymeric precursor, and mixtures thereof, by contacting the substrate with a first composition comprising the material and carbon dioxide, developing portions of the resist layer, and selectively removing developed or undeveloped portions of the resist layer by exposing the resist layer to a second composition comprising carbon dioxide.

Various substrates can be used for the purposes of the invention such as, for example, substrates which may comprise any number of materials including, but not limited to, silicon, ceramics, polymer, gallium arsenide, silicon carbide, or the like, and combinations thereof. In various optional embodiments, at least one intermediate layer (e.g., a silicon dioxide layer) may be present between the substrate and the coating.

The step of contacting the substrate which results in the formation of a coating thereon may be carried out using various techniques. Examples of embodiments include, without limitation, a spin coating method, a dip coating method, and a spray coating method. A spin coating method is preferred, and is described in U.S. Pat. No. 6,001,418 to DeSimone et al., the disclosure of which is incorporated herein by reference in its entirety. A meniscus coating technique can also be employed such as one described, for example, in U.S. Pat. No. 6,083,565 to Carbonell et al., the disclosure of which is incorporated herein by reference in its entirety. A coating method using self-assembling monolayers (SAMs) can also be employed, and may be used in conjunction with $CO_2$. Examples of molecules that are capable of producing SAMs include, without limitation, alkane thiols, fluorinated alkane thiols, and functionalized alkane thiols such as those represented by the formula:

$$X-(CH_2)_n-S-H$$

wherein X may be $-CN$, $-COOH$, $-OCH_3$, $-(OCH_2CH_2)_n-OH$, $-(OCH_2CH_2)_n-OCH_3$, $-H$, phenyl, or substituted phenyl, and n ranges from 1 to 1,000, and more preferably from 2 to 20.

A wide range of components can be used in the present invention to form a coating on the substrate. For the purposes of the invention, the term "materials" can include, without limitation, precursors, monomers, polymeric materials, and the like. Polymers, polymeric precursors, and monomers that are soluble or insoluble in $CO_2$ or $CO_2$ mixed with other gases (insert or otherwise) and co-solvents including surfactants may be necessary to maintain low surface tension and solubility and viscosity as $CO_2$ evaporates, at a number of density and/or pressure conditions are encompassed by the invention. Examples of suitable embodiments include polymeric materials which comprise, without limitation, fluoropolymers, silicon-containing polymers, or combinations thereof, such polymers having a $CO_2$-soluble or "$CO_2$-philic" component. "$CO_2$-philic" refers to the polymer having an affinity for carbon dioxide. Examples of suitable monomers for making the fluoropolymers are numerous and include, but are not limited to, those set forth in U.S. Pat. No. 5,739,223 to DeSimone et al., the disclosure of which is incorporated herein by reference in its entirety. Carbon dioxide soluble monomers may be employed if so desired. Exemplary monomers are fluoroacrylate monomers, fluorostyrene monomers, fluoroalkylene oxide monomers, fluoroolefin monomers, fluorinated alkyl vinyl ether monomers, cyclic fluorinated monomers, and mixtures thereof. Specific preferred monomers include, without limitation, 2-(N-ethylperfluorooctane-sulfonamido) ethyl acrylate, 2-(N-ethylperfluorooctane-sulfonamido) ethyl methacrylate, 2-(N-methylperfluorooctane-sulfonamido) ethyl acrylate, 2-(N-methylperfluorooctane-sulfonamido) ethyl methacrylate, 1,1'-dihydroperfluorooctyl acrylate, 1,1'-dihydroperfluorooctyl methacrylate, 1,1',2,2'-tetrahydroperfluoroalkylacrylate, 1,1',2,2'-tetrahydroperfluoroalkyl methacrylate, α-fluorostyrene, 2,4,6-trifluoromethylstyrene, hexafluoropropylene oxide, perfluorocyclohexane oxide, tetrafluoroethylene, vinylidine fluoride, chlorotrifluoroethylene, perfluoro(propyl vinyl ether), perfluoro(methyl vinyl ether), 2,2-bis-trifluoromethyl-4,5-difluoro-1,3-dioxole, and mixtures thereof, including those set forth in U.S. Pat. No. 6,083,565 to Carbonell et al., the disclosure of which is incorporated herein in its entirety by reference.

Any number of silicon-containing polymers can be used in the present invention, the selection of which is known by those skilled in the art. Examples of silicon-containing polymers include those containing at least one segment such as, without limitation, an alkyl siloxane, a fluoroalkyl siloxane, a chloroalkyl siloxane, and mixtures thereof.

Various polymeric materials that may be used in forming the coating (e.g., photoresist resin) include, without limitation, a polymer resin formed from a t-butyl horbornyl group, maleic anhydride, a fluorinated norbornyl group, and acrylic acid. Such a resin is particularly effective at a radiation of 193 nm wavelength. Another example of a suitable resin is an $O_2$-RIE (Reactive Ion Etch) resistant random terpolymer of 1,1'-dihydroperfluorooctyl methacrylate ("FOMA"), t-butyl methacrylate ("TBM"), and a poly (dimethylsiloxane) macromonomer such as, for example, $CH2=C(CH_3)COOCH_2CH_2CH_2-(Si(CH_3)_2O)_n-SI(CH_3)_2CH_2CH_2CH_2CH_3$ wherein n ranges from 1 to 10,000.

Monomers that may be used include, without limitation, carbon dioxide soluble monomers such as those fluoro- and silicon monomers described herein, as well as (meth) acrylate monomers (e.g., methyl (meth)acrylate) and aryl vinyl monomers (e.g., styrene). These monomers, as well as polymeric precursors, may be deposited as a thin film on the substrate, and polymerized thereon using any suitable technique such as, for example, thermal or photochemical means, including those described in U.S. Pat. No. 6,083,565 to Carbonell et al.

As described above, the coating is imagewise exposed to radiation as described in U.S. Pat. No. 5,665,527 to Allen et al., the disclosure of which is incorporated herein by reference in its entirety. Various radiation techniques including electromagnetic radiation such as deep ultraviolet or X-ray, more preferably deep ultraviolet radiation suitably at a wavelength of about 150–250 nm (248/254 nm), preferably 157 and 193 nm, and e-beam. Suitable radiation sources include, without limitation, mercury, mercury/xenon, xenon lamps, and X-ray. Visible radiation can also be employed. A typical radiation source is ArF excimer or KrF excimer.

The invention may optionally include other embodiments. In one aspect for example, the invention may further comprise the steps of depositing a metal-containing material or an ionic material on the surface of the substrate from which the exposed or the unexposed coating portions was removed, and removing the remaining (exposed or unexposed) coating portion from the substrate. The step of depositing a metal-containing material or an ionic material can be carried out (e.g., processed) by any number of methods including, without limitation, ion implant, metal deposition, and the like. Metal depositions techniques include, without limitation, evaporation sputtering, chemical vapor deposition, or laser-induced deposition. Suitable metal-containing materials include conductive metals such as, but not limited to, aluminum, copper, gold, titanium, tantalum, tungsten, molybdenum, silver, combinations thereof, and alloys thereof. Suitable ionic materials include, but are not limited to, inorganic ions such as boron, phosphorous, or arsenic which can be implanted. Accordingly, n- or p-doped transistors can be formed. In one preferred embodiment, the method further comprises removing the exposed coating portion from the substrate comprises contacting the exposed coating portion with a carbon dioxide containing fluid such that the exposed coating portion is removed from the substrate. In another preferred embodiment, the method comprises removing the unexposed coating portion from the substrate comprises contacting the unexposed coating portion with a carbon dioxide containing fluid such that the unexposed coating portion is removed from the substrate.

In one embodiment of the invention, the exposed coating portion has a lower solubility in carbon dioxide relative to the unexposed coating portions. Accordingly, the step of subjecting the coating to a composition comprising carbon dioxide comprises removing the unexposed coating portion from the substrate such that the exposed coating portion remains. Thereafter, the exposed resist can be removed using carbon dioxide as set forth herein.

Other embodiments that may be encompassed by the invention include, for example, depositing one or more insulating layers (e.g., interlayer dielectrics (ILDs)) and/or one or more anti-reflective coatings on the substrate. These steps may be carried out in a manner appropriate with the other steps of the process of the invention. The ILDs may be used to keep signals in the microelectronic device from straying between the conducting lines on the chip. Examples of ILDs include, without limitation, materials with low dielectric constants such as SILK resins made commercially available by The Dow Chemical Company of Midland, Mich. (described in detail herein) and Teflon AF™ made commercially available by E.I. DuPont de Nemours of Wilmington, Del. Examples of materials for anti-reflective coatings include, without limitation, a fluorinated material based on a fluoroacrylate polymer of polymer precursor.

Figure 1:
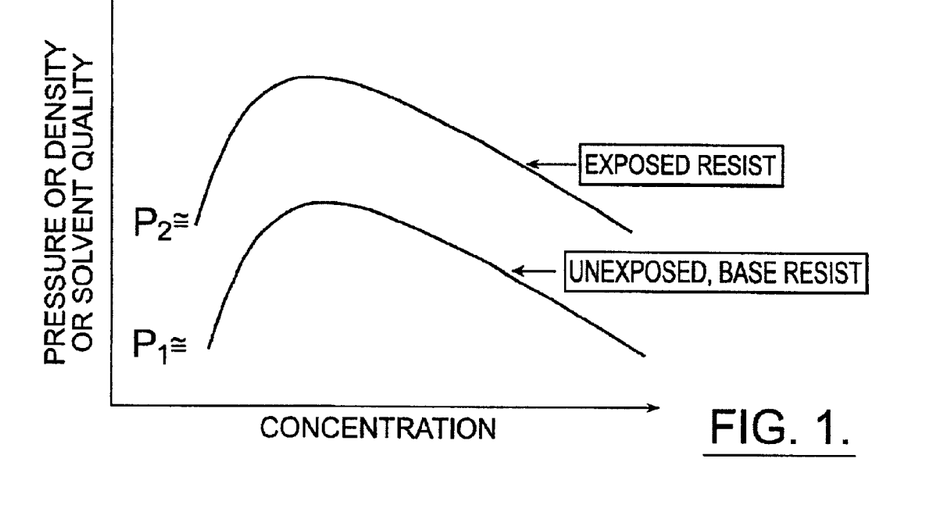
FIG. 1 illustrates a phase diagram of a negative resist before and after exposure radiation.

For the purposes of illustration, an embodiment for illustrating the phase diagram for a negative resist (i.e., base resin) before and after exposure to radiation is set forth in FIG. 1. Above each curve, the resin is soluble, below it is insoluble. In accordance with the invention, the resists (e.g., coatings) of the invention can be deposited using carbon dioxide and also removed using carbon dioxide such as, for example, by a "stripping" technique. For the purposes of the invention, the term "stripping" refers to the removal of remaining resist from a substrate (e.g., wafer) whether it has been exposed to radiation or not. An example of $CO_2$ conditions for providing an integrated negative resist system is as follows:

Deposition Density>$\rho_1$(e.g., liquid $CO_2$)

$\rho_1$<Development Density<$\rho_2$ (e.g., liquid or supercritical $CO_2$)

Removal (e.g., strip) Density>$\rho_2$ (e.g., liquid or supercritical $CO_2$)

As alluded to above, carbon dioxide is employed in a liquid or supercritical phase. If liquid $CO_2$ is used, the temperature employed during the process is preferably below 31° C. As used herein, "supercritical" means that a fluid medium is at a temperature that is sufficiently high that it cannot be liquefied by pressure. The thermodynamic properties of $CO_2$ are reported in Hyatt, *J. Org. Chem.* 49: 5097–5101 (1984); therein, it is stated that the critical temperature of $CO_2$ is about 31° C.

Figure 2:
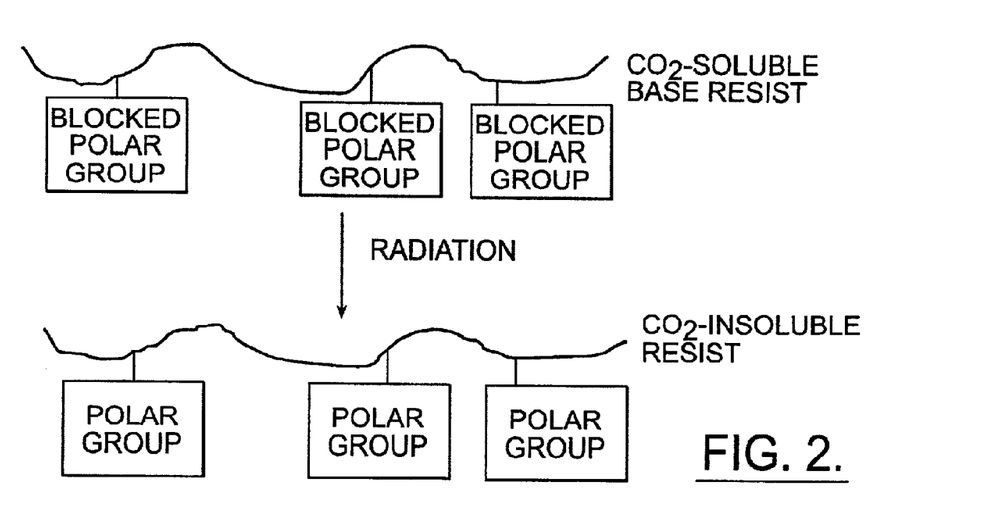
FIG. 2 illustrates the exposure of a polar group to radiation according to embodiments of the present invention.

Although not intending to be bound by theory, it is believed that in one embodiment the decrease in solubility in $CO_2$ of the resist polymer upon exposure to radiation can be achieved by the removal of a blocking group on the polymer which is soluble in carbon dioxide by using a photo acid generator (PAG) that exposes a polar group which renders the polymer insoluble in $CO_2$. Such an embodiment is illustrated in FIG. 2. Examples of PAGs that may be used are numerous and conventionally known in the art including, without limitation, triaryl sulfonium salt, diarylidonium salt, and mixtures thereof. Also, PAGs of the formulas listed hereinbelow can also be used:

wherein n is 2 or 3, and X is preferably I or S.

Thus, by manipulating the composition of the polymeric coating (e.g., selecting various polar groups), one can design the polymer such that it is less soluble upon exposure to radiation than the base resin, while allowing the polymer to be dissolved in $CO_2$ at higher densities and pressures. Thus, one may be able to deposit the polymer using $CO_2$, develop the negative tone image using $CO_2$, and remove (e.g., strip) it using $CO_2$.

In one embodiment, and in accordance with the invention, one is capable of designing the resist such that it can be deposited by utilizing conventional techniques, i.e., known solvents, then developed by employing a first fluid or composition comprising carbon dioxide at a given density, and then stripping the resist using a second fluid or composition comprising carbon dioxide, either in a liquid or supercritical state. The first and second fluids or compositions may be the same or different. Thus, it is believed that the invention is distinguished from U.S. Pat. No. 5,665,527 to Allen et al.

Figure 3:
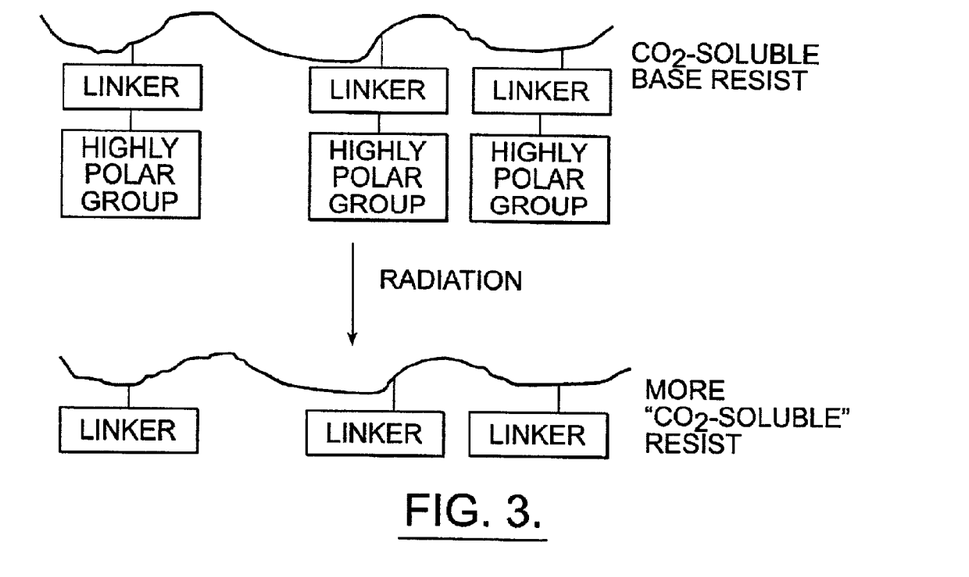
FIG. 3 illustrates a positive tone resist according to embodiments of the present invention.

In another embodiment, the exposed coating portion has a higher solubility in carbon dioxide relative to the unexposed coating portion, and wherein the step of subjecting the coating to a second composition comprising carbon dioxide comprises removing the exposed coating portion from the substrate such that the unexposed coating portion remains. Such an embodiment describes the formation of a positive tone resist, i.e., upon exposure to radiation, the resist becomes more soluble in carbon dioxide. An embodiment illustrating a positive tone resist is set forth in FIG. 3. In one example, the $CO_2$-soluble base resist may have a certain percentage of labile polar groups which, upon exposure to radiation, are removed which enhances the solubility of the exposed coating portion relative to the non-exposed coating portion.

Various polymeric materials may be employed as a coating on the substrate including, without limitation, all of those recited herein. For the purposes of the invention, the term "polymer" encompasses homopolymer, copolymer, terpolymer, and the like. In one embodiment, the component employed in the invention encompasses a polymeric material which is selected from the group consisting of a copolymer of a fluoroacrylate and a component selected from the group consisting of $C(CH_2OH)_3$, a sugar unit, and $SiR_3$ wherein R is a polar group selected from the group consisting of:

—$CH_2CH_2CH_2OH$,

—$CH_2CH_2CH_2$—C≡N, and mixtures thereof.

One specific embodiment of a polymer that may be used as a positive tone resist is a copolymer of fluoroacrylate having the following comonomer structures:

-continued wherein R polar group is preferably selected from the group consisting of:

mixtures thereof.

In one embodiment, upon exposure to radiation, the polar group is removed from the unit, thus resulting in the formation of a carboxylic acid unit that has a higher solubility in $CO_2$ as illustrated by the following:

Not intending to be bound by theory, another embodiment that can allow for an increase of the polymer solubility upon exposure to radiation is to employ a polymer that is capable of undergoing chain scission upon such exposure, e.g., an alternating copolymer between a fluorinated alkyl allyl ether with sulfur dioxide. Upon exposure to radiation (e.g., e-beam), scission of the main polymer chain results and thus a lowering of the polymer molecular weight. Therefore, the resulting polymer has a higher solubility in $CO_2$ relative to the parent base resist of higher molecular weight.

Figure 4:
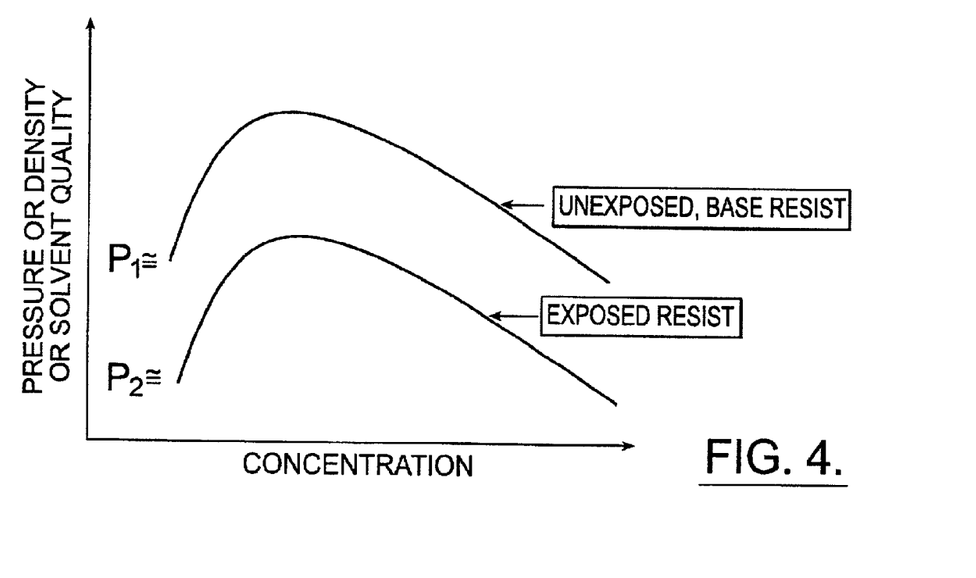
FIG. 4 illustrates a phase diagram of a positive resist.

An example an embodiment of a generic phase diagram for a positive resist is given in FIG. 4. Above each curve, the polymer (e.g., resin) is soluble in $CO_2$, below it is insoluble. In terms of fluid density, the $CO_2$ conditions for achieving an integrated positive resist system is as follows:

Depositing Density$>\rho_1$ $\rho_2<$Development Density$<\rho_1$

Removal (e.g., Strip) Density$>P_1$

In embodiments encompassing either the negative-tone or positive-tone resists, it is possible to incorporate a refractory element such as, for example, silicon, to enable dry pattern transfer steps like $O_2$-RIE particularly in the form of microphase separated morphologies that are capable of elevating the glass transition temperature ($T_g$) of the continuous phase (see e.g., DeSimone et. al. *Macromolecules* 1991, 24 5330-5339).

Any of the carbon dioxide-containing compositions may also include additional components, the selection of which is known to one skilled in the art. Exemplary components include, without limitation, aqueous and organic co-solvents, polymer modifiers, water, rheology modifiers, plasticizing agents, flame retardants, antibacterial agents, flame retardants, and viscosity reduction modifiers.

In another aspect, the invention provides a process of making integrated circuits. The process comprises the steps of:

(a) inserting at least one wafer into an integrated microelectronics process device (IMPD); then (b) contacting the at least one wafer with a first composition comprising carbon dioxide and a polymeric material to deposit the polymeric material on the substrate and form a coating thereon; then (c) imagewise exposing the coating to radiation such that exposed and unexposed coating portions are formed; then (d) subjecting the coating to a second composition comprising carbon dioxide such that either one of the exposed or the unexposed coating portions are removed from the at least one and the other coating portion remains on the coating to form an image thereon (i.e, developing the image with carbon dioxide); then (e) depositing a metal-containing material or an ionic material on the surface of the wafer from which the exposed or the unexposed coating portions were removed; then (f) removing the exposed or unexposed coating portion from the wafer; and then (g) removing the at least one wafer from the IMPD.

Advantageously, steps (a) through (f) are all performed repeatedly in the IMPD without the wafer being removed from the IMPD. In a preferred embodiment (b) through (f) are repeated at least once without removing the at least one wafer from the IMPD. One example of an IMPD that can be employed is described in U.S. Pat. No. 6,045,877 to Gleason et al., the disclosure of which is incorporated herein by reference in its entirety.

In another aspect, the invention encompasses a process of making integrated circuits. The process comprises the steps of:

(a) inserting at least one wafer into an integrated microelectronics process device (IMPD); then (b) contacting the at least one wafer with a first composition and a component selected from the group consisting of at least one polymeric material, at least one polymeric precursor, and at least one monomer, and mixtures thereof to deposit the component on the wafer and form a coating thereon; then (c) imagewise exposing the coating to radiation such that exposed and unexposed coating portions are formed; then (d) subjecting the coating to a second composition comprising carbon dioxide such that either one of the exposed or the unexposed coating portions are removed from the at least one and the other coating portion remains on the coating to form an image thereon (i.e., developing the image with carbon dioxide); then (e) depositing a metal-containing material or an ionic material on the surface of the wafer from which the exposed or the unexposed coating portions are removed; then (f) removing the exposed or unexposed coating portion from the wafer; and then (g) removing the at least one wafer from the IMPD;

wherein said steps (a) through (f) are performed in the IMPD without the at least one wafer being removed from the IMPD.

In another aspect, the invention encompasses a process of making integrated circuits. The process comprises the steps of:

(a) contacting at least one wafer with a first composition and a component selected from the group consisting of at least one polymeric material, at least one polymeric precursor, and at least one monomer, and mixtures thereof to deposit the component on the wafer and form a coating thereon; then (b) imagewise exposing the coating to radiation such that exposed and unexposed coating portions are formed; then (c) subjecting the coating to a second composition comprising carbon dioxide such that either one of the exposed or the unexposed coating portions are removed from the at least one and the other coating portion remains on the coating to form an image thereon (i.e., developing the image with carbon dioxide); then (d) depositing a metal-containing material or an ionic material on the surface of the wafer from which the exposed or the unexposed coating portions are removed; and then (e) removing the exposed or unexposed coating portion from the wafer.

wherein said steps (a) through (e) are performed in the IMPD without the at least one wafer being removed from an IMPD. In a preferred embodiment (a) through (e) are repeated at least once without removing the at least one wafer from an IMPD. In another preferred embodiment, a selective etching step such as those described herein may be employed subsequent to step (c) but prior to step (d) to selectively remove various materials that may be present on the substrate including, without limitation, those described herein.

The first and second compositions utilized in the above embodiments may be the same or different.

The above steps may be carried out employing any of the embodiments described hereinabove, as well as others. For example, the component on the wafer, preferably the polymeric material, may be deposited using a chemical vapor deposition (CVD) method. CVD methods are known in the art, and one example of a CVD method is described in U.S. Pat. No. 6,045,877 to Gleason et al. A particularly preferred polymeric material is a fluoropolymer.

The fluid composition may comprise various materials such as, in one embodiment, carbon dioxide or a carbon dioxide/co-solvent mixture.

The present invention may be carried out by employing various processing equipment. In one embodiment, for example, a spin coater can be used to deposit polymeric material on the substrate. One example of a spin coater is described in U.S. Pat. No. 6,001,418 to DeSimone et al. that has ports, sub-chambers, to accommodate imaging, $CO_2$ removal, vacuum development, and/or stripping techniques. This embodiment provides one example of an IMPD. Modifications from the above may be made without departing from the scope of the invention.

The present invention is highly advantageous in that the deposition, development, and removal (e.g., stripping) of the resist used in processing microelectric substrates can be carried out in a closed system, in contrast to conventional solvent-based processes. Moreover, due to the environmentally benign nature of carbon dioxide, and $CO_2$ mixtures mentioned herein, and its relative ease of handling, one has the ability to design microelectronics processing equipment (e.g., metal deposition facilities, etch processes, and $O_2$-Reactive Ion Etch (RIE) processes that are integrated with carbon dioxide based deposition, development, and stripping equipment. Moreover, post-processed carbon dioxide is typically easier to recover than organic or aqueous wastes. The low solvent viscosity of carbon dioxide and $CO_2$ solutions also makes it highly desirable for penetrating increasingly smaller gaps between features in microelectronic substrates. Such an integrated design of the microelectronics processing equipment can avoid the repeated entry, removal, and re-entry steps that are believed to be inherent in non-integrated processes. In one embodiment, for example, one could process a wafer repeatedly within one device without removing it in order to spin coat or develop a photoresist coating. Such an integrated system can therefore eliminate or significantly reduce the need for extensive and costly clean room facilities that are often required to reduce wafer contamination upon removal from closed systems.

In other embodiments, the processes of the invention may include other steps. For example, in embodiments where an intermediate layer is present between the coating portion and the substrate, the process may further comprise the step of selectively etching the intermediate layer using the developed coating portion as an etching mask. The intermediate layer may comprise many of the components set forth herein, the selection of which is known to one skilled in the art. In a preferred embodiment, the intermediate layer is present in the form of a planarization layer such as one comprising a novalac resin, or an interlayer dielectric resin such as one selected from the SiLK™ family of dielectric resins made commercially available from The Dow Chemical Company located in Midland, Mich. Exemplary resins in the SiLK™ family include SiLK™ I Resin SiLK™ H Resin, and CYCLOTENE™* Resins.

The etching may be carried out by employing various techniques known to one skilled in the art. For example, the step of selectively etching the intermediate layer comprises contacting the intermediate layer with a gas selected from the group consisting of oxygen, chlorine, fluorine, and mixtures thereof. It should be appreciated that the term "etching" is broadly defined and may include methods which completely or partially expose the underlying substrate. The etching step may be used in conjunction with any of the other steps described herein as deemed appropriate by one skilled in the art. For example, subsequent to etching, the exposed substrate may be contacted (e.g., showered) with metal-containing materials doped with an ionic material including inorganic ions such as, without limitation, boron, arsenic, or phosphorous.

The present invention will now be described by the examples which follow. It should be understood that these examples merely illustrate the invention, and do not limit the scope of the invention as defined by the claims.

EXAMPLE 1

Solubility Study of Polymer Resin

A composition comprising carbon dioxide, poly(FOMA-r-TBM), and a photoacid generator is exposed to radiation. The following illustrates the reaction which occurs resulting in the formation of poly(FOMA-r-MAA):

The polymer contains 33 mol percent of TBA. Poly(FOMA-r-TBM) is determined to be soluble at 1500 psi as measured by a room temperature cloud point measurement.[1] Poly(FOMA-r-MAA) is determined to be insoluble at 5000 psi as measured by the cloud point measurement. Using 33 mol percent of TBA provides solubility contrast for spin coating, and development with carbon dioxide.

[1] 4 weight percent $CO_2$

EXAMPLE 2

Solubility Study of Polymer Resin

The procedure according to Example 1 is followed except that 20 mol percent of TBM is used. Poly(FOMA-r-TBM) is determined to be soluble at 1350 psi as measured by a room temperature cloud point measurement. Poly(FOMA-r-MAA) is determined to be insoluble at 5000 psi as measured by the cloud point measurement. Using 20 mol percent of TBA provides solubility contrast for spin coating, and development with carbon dioxide.

EXAMPLE 2

Solubility Study of Polymer Resin

The procedure according to Example 1 is followed except that 12 mol percent of TBM is used. Poly(FOMA-r-TBM) is determined to be soluble at 1260 psi as measured by a room temperature cloud point measurement. Poly(FOMA-r-MAA) is determined to be insoluble at 3000 psi as measured by the cloud point measurement. Using 12 mol percent of TBA provides solubility contrast for spin coating, development, and stripping with carbon dioxide.

This invention encompasses methods of forming patterned resist layers on a variety of substrates (including but not limited to silicon, ceramics, polymer, gallium arsenide, silicon carbide, glass, polycarbonate, quartz, poly (tetrafluoroethylene), gold). These resist layers include at least one monomer, a polymer, a photoactive compound and carbon dioxide as a casting solvent and/or processing solvent.

Examples of methods to cast are spin coating (e.g., as described in U.S. Pat. No. 6,001,418, the disclosure of which is incorporated herein by reference in its entirety), free-meniscus coating (e.g., as described in U.S. Pat. No. 6,083,565, the disclosure of which is incorporated herein by reference in its entirety), dip coating, spray coating, and self-assembling monolayers including those described hereinabove.

The materials for coatings include, without limitation, precursors, monomers, polymers, and oligomers such that these materials are soluble in $CO_2$, as well as $CO_2$ in combination with inert gases, co-solvents, and $CO_2$-soluble surfactants, as well as other gases that can control viscosity, surface tension, and density of the liquid phase. "$CO_2$-philic" include those set forth herein as well as, without limitation, perfluoroalkyl substituted norbornene monomers, dinorbornene, and alicyclic monomers that increase etch resistance and $T_g$ of the polymers. Siloxane polymers may be employed, as well as coating materials.

Other examples of resist materials are fluorinated resists include those described in WO 00/67072, the disclosure of which is incorporated herein by reference in its entirety. These resists may include, as an example appropriate components, e.g., photoactive components including, without limitation, those described herein as deemed necessary.

In certain embodiments, resists comprise a fluorine-containing polymer comprising a repeat unit derived from at least one ethylenically unsaturated compound containing a fluoroalcohol functional group having the structure:

—C(R$_f$)(R$_f$)OH wherein R$_f$ and R$_f$ are the same or different fluoroalkyl groups of from 1 to about 10 carbon atoms or taken together are $(CF_2)_n$ wherein n is 2 to 10. The fluorine-containing polymer has an absorption coefficient of less than 4.0 pm~I at a wavelength of 157 nm.

In another embodiment, the resist comprises a fluorine-containing copolymer comprising a repeat unit derived from at least one ethylenically unsaturated compound characterized in that at least one ethylenically unsaturated compound is cyclic or polycyclic, at least one ethylenically unsaturated compound contains at least one fluorine atom covalently attached to an ethylenically unsaturated carbon atom, and at least one ethylenically unsaturated compound is comprised of a fluoroalcohol functional group having the structure:

—C(R$_f$)(R$_f$)OH wherein R$_f$ and R$_f$' are the same or different fluoroalkyl groups of from 1 to about 10 carbon atoms or taken together are $(CF_2)_n$ wherein n is 2 to 10. The fluorine-containing copolymer may contains sufficient functionality to render the photoresist developable so as to produce a relief image upon imagewise exposure to ultraviolet radiation having wavelength of <365 nm.

In another embodiment, the resist comprises a fluorine-containing copolymer comprising:

(i) a repeat unit derived from at least one ethylenically unsaturated compound containing at least three fluorine atoms covalently attached to two ethylenically unsaturated carbon atoms; and (ii) a repeat unit derived from an ethylenically unsaturated compound comprised of a fluoroalcohol functional group having the structure:

—C(R$_f$)(R$_f$)OH wherein R$_f$ and R$_f$' are the same or different fluoroalkyl groups of from 1 to about 10 carbon atoms or taken together are $(CF_2)_n$ wherein n is 2 to 10. The fluorine-containing copolymer contains sufficient functionality to render the photoresist developable so as to produce a relief image upon imagewise exposure to ultraviolet radiation having wavelength of <365 nm.

In yet another embodiment, a photoresist comprises:

(a) a fluorine-containing copolymer comprising a repeat unit derived from at least one ethylenically unsaturated compound containing a fluoroalcohol functional group having the structure:

—XCH$_2$C(R$_f$)(R$_f$')OH wherein R$_f$ and R$_f$' are the same or different fluoroalkyl groups of from 1 to about 10 carbon atoms or taken together are (CF$_2$)$_n$ wherein n is 2 to 10; and X is selected from the group consisting of sulfur. oxygen, nitrogen, phosphorous, other Group Va element. and other Group VIa element.

(b) at least one photoactive component; wherein the fluorine-containing copolymer contains sufficient functionality to render the photoresist developable so as to produce a relief image upon imagewise exposure to ultraviolet radiation having wavelength of <365 nm.

In certain embodiments, a photoresist comprises a fluorine-containing polymer comprising the structure:

wherein each of R$_1$, R$_2$, R$_3$, and R$_4$ independently is hydrogen, a halogen atom, a hydrocarbon group containing from 1 to 10 carbon atoms, a substituted hydrocarbon group, an alkoxy group, a carboxylic acid, a carboxylic acid ester, or a functional group containing the structure: —C(R$_f$)(R$_f$')OR$_b$, wherein R$_f$ and R$_f$' are the same or different fluoroalkyl groups of from 1 to 10 carbon atoms or taken together are (CF$_2$)$_n$ wherein n is 2 to 10; R$_b$ is hydrogen or an acid-or base-labile protecting group; p is the number of repeat units in the polymer; r is 0-4; at least one of the repeat units has a structure whereby at least one of R$_1$, R$_2$, R$_3$, and R$_4$ contains the structure C(R$_f$)(R$_f$')OR$_b$; and wherein the fluorine-containing polymer has an absorption coefficient of less than 4.0 absorption unit per micron at a wavelength of 157 nm.

Fluorinated Alcohol (Co) Polymers

A given fluorine-containing polymer or copolymer described above comprises a repeat unit (discussed infra) derived from at least one ethylenically unsaturated compound containing a fluoroalcohol functional group. These fluoroalkyl groups are designated as R$_f$ and R$_f$', which can be partially fluorinated alkyl groups or fully fluorinated alkyl groups (i. e., perfluoroalkyl groups). Broadly, R$_f$ and R$_f$' are the same or different fluoroalkyl groups of from 1 to about 10 carbon atoms or taken together are (CF$_2$)$_n$ wherein n is 2 to 10. (In the last sentence, the terms "taken together" indicate that R$_f$ and R$_f$' are not separate. discrete fluorinated alkyl groups, but that together they form a ring structure such as is illustrated below in case of a 5-membered ring:

R$_f$ and R$_f$' can be partially fluorinated alkyl groups without limit according to the invention except that there should be a sufficient degree of fluorination present to impart acidity to the hydroxyl (—OH) of the fluoroalcohol functional group, such that the hydroxyl proton is substantially removed in basic media, such as in aqueous sodium hydroxide solution or tetraalkylammonium hydroxide solution.

In preferred cases according to the invention, there will be sufficient fluorine substitution present in the fluorinated alkyl groups of the fluoroalcohol functional group such that the hydroxyl group will have a pKa value as follows: 5<pKa<11. Preferably, R$_f$ and R$_f$' are independently perfluoroalkyl group of 1 to 5 carbon atoms, and, most preferably, R$_f$ and R$_f$' are both trifluoromethyl (CF$_3$).

As is well known to those skilled in the polymer art, an ethylenically unsaturated compound undergoes free radical polymerization to afford a polymer having a repeat unit that is derived from the ethylenically unsaturated compound.

Specifically, an ethylenically unsaturated compound having structure:

that undergoes free radical polymerization will afford a polymer having a repeat unit:

where P, Q, S, and T independently can be the same or different and illustratively could be fluorine, hydrogen, chlorine, and trifluoromethyl.

If only one ethylenically unsaturated compound undergoes polymerization, the resulting polymer is a homopolymer. If two or more distinct ethylenically unsaturated compounds undergo polymerization, the resulting polymer is a copolymer.

Some representative examples of ethylenically unsaturated compounds and their corresponding repeat units are given below:

wherein R is a hydrocarbon-containing group, preferably $C_1$ to $C_8$ alkyl.

Each fluorine-containing copolymer according to this invention has an absorption coefficient of less than 4.0 absorption units per micron at a wavelength of 157 nm, preferably of less than 3.5 absorption units per micron at this wavelength, more preferably, of less than 3.0 absorption units per micron at this wavelength, and, still more preferably, of less than 2.5 absorption units per micron at this wavelength.

The fluorinated polymers, photoresists, and processes that involve a fluoroalcohol functional group may have the structure:

—XCH$_2$C(R$_f$)(R$_f'$)OH wherein R$_f$ and R$_f'$ are the same or different fluoroalkyl groups of from 1 to about 10 carbon atoms or taken together are (CF$_2$)$_n$ wherein n is 2 to 10; X is selected from the group consisting of oxygen, sulfur, nitrogen, phosphorous, other Group Va element, and other Group VIa element. By the terms "other Group Va element" and "other Group VIa element", these terms are understood to mean herein any other element in one of these groups of the periodic table that is other than the recited elements (i. e., oxygen, sulfur, nitrogen, phosphorous) in these groups. Oxygen is the preferred X group.

Some illustrative, but non limiting, examples of representative comonomers containing a fluoroalcohol functional group and within the scope of the invention are presented below:

Various bifunctional compounds which can initially afford crosslinking and subsequently be cleaved (e. g., upon exposure to strong acid) are also useful as comonomers in the copolymers of this invention. As an illustrative, but nonlimiting example, the bifunctional comonomer NB—F—OMOMO—F—NB is desirable as a comonomer in the copolymers of this invention. This and similar bifunctional comonomers, when present in the copolymer component(s) of photoresist compositions of this invention, can afford copolymers that are of higher molecular weight and are lightly crosslinked materials. Photoresist compositions, incorporating these copolymers comprised of bifunctional monomers, can have improved development and imaging characteristics, since, upon exposure (which photochemically generates strong acid as explained infra), there results cleavage of the bifunctional group and consequently a very significant drop in molecular weight, which factors can afford greatly improved development and imaging characteristics (e. g., improve contrast).

Exposure at I-line (365 nm), DUV (248–254 nm, 193 nm), VUV (157 nm), EUV (aka x-ray 13.4 nm).

The invention encompasses negative-tone and positive-tone resists including, without limitation, those described herein.

Negative-tone resists are ones going from less polar to more polar by a wide range of chemistries known to those familiar in the art. The polarity change is typically brought about by an acid catalyzed reaction that causes a change in functional group. Negative-tone resists from a change in molecular weight, including crosslinking etc.

Positive-tone resists are ones going from a more polar group going to a less-polar group. Examples include, but not limited to, those set forth above and the pinacol rearrangement:

Synthesis of pinacol monomer:

A number of photoacid generators can be used including, without limitation, those known to one skilled in the art. Examples of PAGs include triaryl sulfonium salts and diaryliodonium salts with perfluoroalkyl sulfonates as the anion. Other anions included are those found in U.S. Pat. No. 5,554,664, the disclosure of which is incorporated herein by reference in its entirety such as, without limitation, perfluoroalkyl sulfonyl imides and perfluoroalkyl sulfonyl methides. These PAGs are believed to have enhanced solubility characteristics and acidity.

Another example of a PAG which may be employed:

Preferably, $R_f$ is a fluoroalkyl substituent. It is preferred that the number of carbon atoms in the fluoroalkyl group range from 4 to 12, although other values are encompassed by the invention. Although not intending to be bound by any theory, it is believed that this range is optimal for controlled solubility and glass transition temperature ($T_g$). Most preferably, the number of carbons is 6.

Preferably, R is either a fluoroalkyl substituent or an aryl-containing group (e.g., benzene or p-toluene). It is believed that the more acidic the sulfonic acid, the less stable the compound.

Examples of monomers and polymers that may be used include:

| $R_1$ | $R_2$ | $R_3$ | $R_4$ |
|---|---|---|---|
| F | F | F | F |
| F | F | F | $R_f$ |
| H | H | H | $R_f$ |
| $R_f$ | H | H | $R_f$ |
| H | H | $CH_3$ | $COOR_f$ |
| H | H | H | $COOR_f$ |
|   |   |   | $(CH_2)_nR_f$ n = 1,2 |
| $R_f$ | F | F | $R_f$ | wherein $R_1$, $R_2$, $R_3$, and $R_4$ are defined in the table above. The above monomers may be used for copolymerization with other monomers disclosed herein. Preferred monomers for use in copolymerization include, without limitation, tetrafluoroethylene and hexafluoropropylene.

This invention addresses problems associated with image collapse, resist transparency at 157 nm, potential solubility problems of new resist materials in a readily available solvent, elimination of organic solvents and aqueous developers (i.e., turning a wet process into a dry process). The invention uses differences in polarity to create solubility differences in supercritical and liquid $CO_2$.

The present invention may be used for the manufacture of semiconductor devices. In addition, the invention may be used for other non-lithographic processes in which a polymer must be deposited and removed from a surface in a controlled fashion (e.g., coating of low-k dielectrics, coating on solid substrates, fiber optics, optical components, glass, ceramics, metal, and plastics).

In the event that photoresist etch resistance difficulties may exist, such problems can be addressed by structure modification to make the polymers more resistant to etch. In the event that the polymers display adhesion problems, the $CO_2$ deposition process can help to potentially mitigate the difficulty in wetting the surface and reduce the chance of potentially catastrophic defects.

The invention has been described with respect to the preferred embodiments set forth above. It should be appreciated that these embodiments are provided for illustrative purposes only, and do not limit the scope of the invention.

The invention has been described above in reference to its preferred embodiments. These embodiments do not serve to limit the scope of the invention as defined by the claims.

That which is claimed:

1. A process of forming a resist image in a microelectronic substrate, said process comprising the steps of:
   contacting the substrate with a first composition comprising carbon dioxide and a component selected from the group consisting of at least one polymeric precursor, at least one monomer, at least one polymeric material, and mixtures thereof, to deposit the component on the substrate and form a coating thereon; then
   imagewise exposing the coating to radiation such that exposed and unexposed coating portions are formed; then
   subjecting the coating to a second composition comprising carbon dioxide such that either one of the exposed or the unexposed coating portions are removed from the substrate and the other coating portion is developed and remains on the substrate to form an image thereon; and
wherein each step of the process is performed in a closed system.

2. The process according to claim 1, wherein the exposed coating portion has a lower solubility in carbon dioxide relative to the unexposed coating portions, and wherein said step of subjecting the coating to a second composition comprising carbon dioxide comprises removing the unexposed coating portion from the substrate such that the exposed developed coating portion remains.

3. The process according to claim 2, wherein the polymeric material comprises a fluoropolymer.

4. The process according to claim 3, wherein the fluoropolymer is formed from monomers selected from the group consisting of fluoroacrylate monomers, fluorostyrene monomers, fluoroalkylene oxide monomers, fluorolefin monomers, fluorinated alkyl vinyl ether monomers, cyclic fluorinated monomers, and mixtures thereof.

5. The process according to claim 4, wherein the monomers are selected from the group consisting of 2-(N-ethylperfluorooctane-sulfonamido) ethyl acrylate, 2-(N-ethylperfluorooctane-sulfonamido) ethyl methacrylate, 2-(N-methylperfluorooctane-sulfonamido) ethyl acrylate, 2-(N-methylperfluorooctane-sulfonamido) ethyl methacrylate, 1,1'-dihydroperfluorooctyl acrylate, 1,1'-dihydroperfluorooctyl methacrylate, 1,1',2,2'-tetrahydroperfluoroalkylacrylate, 1,1',2,2'-tetrahydroperfluoroalkyl-methacrylate, α-fluorostyrene, 2,4,6-trifluoromethylstyrene, hexafluoropropylene oxide, perfluorocyclohexane oxide, tetrafluoroethylene, vinylidine fluoride, chlorotrifluoroethylene, perfluoro(propyl vinyl ether), perfluoro(methyl vinyl ether), 2,2-bis-trifluoromethyl-4,5-difluoro-1,3-dioxole, and mixtures thereof.

6. The process according to claim 2, wherein the polymeric material comprises a silicon-containing polymer.

7. The process according to claim 6, wherein the silicon-containing polymer comprises at least one segment selected from the group consisting of an alkyl siloxane, a fluoroalkyl siloxane, a chloroalkyl siloxane, and mixtures thereof.

8. The process according to claim 2, wherein an intermediate layer is present between the coating portion and the substrate, and said process further comprising the step of selectively etching the intermediate layer using the developed coating portion as an etching mask.

9. The process according to claim 8, wherein said step of selectively etching the intermediate layer comprises contacting the intermediate layer with a gas selected from the group consisting of oxygen, chlorine, fluorine, and mixtures thereof.

10. The process according to claim 2, further comprising the steps of:
    depositing a metal-containing material or an ionic material on the surface of the substrate from which the unexposed coating portions were removed; and then
    removing the exposed coating portion from the substrate.

11. The process according to claim 10, wherein the metal-containing material comprises at least one metal selected from the group consisting of aluminum, copper, gold, titanium, tantalum, tungsten, molybdenum, silver, and alloys thereof.

12. The process according to claim 10, wherein the ionic material is selected from the group consisting of boron, phosphorous, arsenic, and combinations thereof.

13. The process according to claim 10, wherein said step of removing the exposed coating portion from the substrate comprises contacting the exposed coating portion with a carbon dioxide containing fluid such that the exposed coating portion is removed from the substrate.

14. The process according to claim 2, wherein the radiation is selected from the group consisting of visible, ultraviolet, x-ray, and e-beam.

15. The process according to claim 14 wherein the radiation is ultraviolet or x-ray and the composition comprising polymeric material includes a photo acid generator.

16. The process according to claim 2, wherein said step of contacting the substrate with a first composition comprising carbon dioxide and a component comprises coating the component using a method selected from the group consisting of a spin coating method, a dip coating method, a meniscus coating method, a coating method using self-assembled monolayers, and a spray coating method.

17. The process according to claim 2, wherein the polymeric material is a copolymer of 1,1'-dihydroperfluorooctyl methacrylate and t-butyl methacrylate.

18. The process according to claim 1, wherein the exposed coating portion has a higher solubility in carbon dioxide relative to the unexposed coating portion, and wherein said step of subjecting the coating to a second composition comprising carbon dioxide comprises removing the exposed coating portion from the substrate such that the unexposed coating portion remains.

19. The process according to claim 18, wherein the polymeric material comprises a fluoropolymer.

20. The process according to claim 19, wherein the fluoropolymer is formed from monomers selected from the group consisting of fluoroacrylate monomers, fluorostyrene monomers, fluoroalkylene oxide monomers, fluorolefin monomers, fluorinated alkyl vinyl ether monomers, cyclic fluorinated monomers, and mixtures thereof.

21. The process according to claim 20, wherein the monomers are selected from the group consisting of 2-(N-ethylperfluorooctane-sulfonamido) ethyl acrylate, 2-(N-ethylperfluorooctane-sulfonamido) ethyl methacrylate, 2-(N-methylperfluorooctane-sulfonamido) ethyl acrylate, 2-(N-methylperfluorooctane-sulfonamido) ethyl methacrylate, 1,1'-dihydroperfluorooctyl acrylate, 1,1-dihydroperfluorooctyl methacrylate, 1,1',2,2'- tetrahydroperfluoroalkylacrylate, 1,1',2,2'-tetrahydroperfluoroalkyl-methacrylate, α-fluorostyrene, 2,4,6-trifluoromethylstyrene, hexafluoropropylene oxide, perfluorocyclohexane oxide, tetrafluoroethylene, vinylidine fluoride, chlorotrifluoroethylene, perfluoro(propyl vinyl ether), perfluoro(methyl vinyl ether), 2,2-bis-trifluoromethyl-4,5-difluoro-1,3-dioxole, and mixtures thereof.

22. The process according to claim 18, wherein the polymeric material comprises a silicon-containing polymer.

23. The process according to claim 22, wherein the silicon-containing polymer comprises at least one segment selected from the group consisting of an alkyl siloxane, a fluoroalkyl siloxane, a chloroalkyl siloxane, and mixtures thereof.

24. The process according to claim 18, wherein an intermediate layer is present between the coating portion and the substrate, and said process further comprising the step of selectively etching the intermediate layer using the developed coating portion as an etching mask.

25. The process according to claim 24, wherein said step of selectively etching the intermediate layer comprises contacting the intermediate layer with a gas selected from the group consisting of oxygen, chlorine, fluorine, and mixtures thereof.

26. The process according to claim 18, further comprising the steps of:
depositing a metal-containing material or an ionic material on the surface of the substrate from which the exposed coating portions were removed; and then
removing the unexposed coating portion from the substrate.

27. The process according to claim 26, wherein the metal-containing material comprises at least one metal selected from the group consisting of aluminum, copper, gold, titanium, tantalum, tungsten, molybdenum, silver, and alloys thereof.

28. The process according to claim 27, wherein the ionic material is selected from the group consisting of boron, phosphorous, arsenic, and combinations thereof.

29. The process according to claim 26, wherein said step of removing the unexposed coating portion from the substrate comprises contacting the unexposed coating portion with a carbon dioxide containing fluid such that the unexposed coating portion is removed from the substrate.

30. The process according to claim 18, wherein radiation is selected from the group consisting of visible, ultraviolet, X-ray, and e-beam.

31. The process according to claim 18, wherein the radiation is ultraviolet or x-ray and the first composition comprises a photo acid generator.

32. The process according to claim 18, wherein said step of contacting the substrate with a first composition comprising carbon dioxide and a component comprises coating the component using a method selected from the group consisting of a spin coating method, a dip coating method, a meniscus coating method, a coating method using self-assembled monolayers, and a spray coating method.

33. The process according to claim 18, wherein the component includes a polymeric material is selected from the group consisting of a copolymer of a fluoroacrylate and a component selected from the group consisting of $C(CH_2OH)_3$, a sugar unit, and $SiR_3$ wherein R is a polar group selected from the group consisting of:

—$CH_2CH_2CH_2OH$, $CH_2CH_2CH_2$—C≡N, and mixtures thereof.

34. A process of forming integrated circuits comprising the steps of:
(a) contacting at least one wafer with a first composition comprising carbon dioxide and a component selected from the group consisting of at least one polymeric material, at least one polymeric precursor, and at least one monomer, and mixtures thereof, to deposit the component on the wafer and form a coating thereon; then
(b) imagewise exposing the coating to radiation such that exposed and unexposed coating portions are formed; then
(c) subjecting the coating to a second composition comprising carbon dioxide such that either one of the exposed or the unexposed coating portions are removed from the at least one wafer and the other coating portion is developed and remains on the coating to form an image thereon; then
(d) depositing a metal-containing material or an ionic material on the surface of the wafer from which the exposed or the unexposed coating portions are removed; and then
(e) removing the exposed or unexposed coating portion from the wafer;
wherein said steps (a) through (e) are performed in an integrated microelectronic process device (IMPD) without the at least one wafer being removed from the IMPD.

35. The process according to claim 34, wherein said step (a) comprises depositing the component on the wafer using a chemical vapor deposition (CVD) method.

36. The process according to claim 34, wherein the first composition comprises (1) carbon dioxide or (2) carbon dioxide and a co-solvent mixture.

37. The process according to claim 34, wherein said steps (a) through (e) are repeated at least once without removing the at least one wafer from the IMPD.

38. The process according to claim 34, wherein an intermediate layer is present between the coating portion and the substrate, and said process further comprising the step of selectively etching the intermediate layer using the developed coating portion as an etching mask.

39. The process according to claim 38, wherein said step of selectively etching the intermediate layer comprises contacting the intermediate layer with a gas selected from the group consisting of oxygen, chlorine, fluorine, and mixtures thereof.

40. The process according to claim 34, wherein the exposed coating portion has a lower solubility in carbon dioxide relative to the unexposed coating portions, and wherein said step of subjecting the coating to a second composition comprising carbon dioxide comprises removing the unexposed coating portion from the substrate such that the exposed coating portion remains.

41. The process according to claim 34, wherein the polymeric material comprises a fluoropolymer.

42. The process according to claim 41, wherein the fluoropolymer is formed from monomers selected from the group consisting of fluoroacrylate monomers, fluorostyrene monomers, fluoroalkylene oxide monomers, fluoroolefin monomers, fluorinated alkyl vinyl ether monomers, cyclic fluorinated monomers, and mixtures thereof.

43. The process according to claim 42, wherein the monomers are selected from the group consisting of 2-(N-ethylperfluorooctane-sulfonamido) ethyl acrylate, 2-(N-ethylperfluorooctane-sulfonamido) ethyl methacrylate, 2-(N-methylperfluorooctane-sulfonamido) ethyl acrylate, 2-(N-methylperfluorooctane-sulfonamido) ethyl methacrylate, 1,1'-dihydroperfluorooctyl acrylate, 1,1'-dihydroperfluorooctyl methacrylate, 1,1',2,2'-tetrahydroperfluoroalkylacrylate, 1,1',2,2'-tetrahydroperfluoroalkyl-methacrylate, α-fluorostyrene, 2,4,6-trifluoromethylstyrene, hexafluoropropylene oxide, perfluorocyclohexane oxide, tetrafluoroethylene, vinylidine fluoride, chlorotrifluoroethylene, perfluoro(propyl vinyl ether), perfluoro(methyl vinyl ether), 2,2-bis-trifluoromethyl-4,5-difluoro-1,3-dioxole, and mixtures thereof.

44. The process according to claim 34, wherein the polymeric material comprises a silicon-containing polymer.

45. The process according to claim 44, wherein the silicon-containing polymer comprises at least one segment selected from the group consisting of an alkyl siloxane, a fluoroalkyl siloxane, a chloroalkyl siloxane, and mixtures thereof.

46. The process according to claim 34, wherein the metal-containing material comprises at least one metal selected from the group consisting of aluminum, copper, gold, titanium, tantalum, tungsten, molybdenum, silver, and alloys thereof.

47. The process according to claim 34, wherein the ionic material is selected from the group consisting of boron, phosphorous, arsenic, and combinations thereof.

48. The process according to claim 34, wherein the radiation is selected from the group consisting of visible, ultraviolet, x-ray, and e-beam.

49. The process according to claim 48, wherein the radiation is ultraviolet or x-ray and the polymeric material comprises a photo acid generator.

50. The process according to claim 34, wherein said step of removing the exposed coating portion from the substrate comprises contacting the exposed coating portion with a carbon-dioxide containing fluid such that the exposed coating portion is removed from the substrate.

51. The process according to claim 50, wherein said step of contacting the substrate with a first composition comprising carbon dioxide and a component comprises coating the component using a method selected from the group consisting of a spin coating method, a dip coating method, a meniscus coating method, a coating method using self-assembled monolayers, and a spray coating method.

52. The process according to claim 34, wherein the polymeric material is a copolymer of 11"-dihydroperfluorooctyl methacrylate and t-butyl methacrylate.

53. The process according to claim 34, wherein the exposed coating portion has a higher solubility in carbon dioxide relative to the unexposed coating portions, and wherein said step of subjecting the coating to a second composition comprising carbon dioxide comprises removing the exposed coating portion from the substrate such that the unexposed coating portion remains.

54. The process according to claim 53, wherein the polymeric material comprises a fluoropolymer.

55. The process according to claim 54, wherein the fluoropolymer is formed from monomers selected from the group consisting of fluoroacrylate monomers, fluorostyrene monomers, fluoroalkylene oxide monomers, fluoroolefin monomers, fluorinated alkyl vinyl ether monomers, cyclic fluorinated monomers, and mixtures thereof.

56. The process according to claim 55, wherein the monomers are selected from the group consisting of 2-(N-ethylperfluorooctane-sulfonamido) ethyl acrylate, 2-(N-ethylperfluorooctane-sulfonamido) ethyl methacrylate, 2-(N-methylperfluorooctane-sulfonamido) ethyl acrylate, 2-(N-methylperfluorooctane-sulfonamido) ethyl methacrylate, 1,1'-dihydroperfluorooctyl acrylate, 1,1'-dihydroperfluorooctyl methacrylate, 1,1',2,2'-tetrahydroperfluoroalkylacrylate, 1,1',2,2'-tetrahydroperfluoroalkyl-methacrylate, α-fluorostyrene, 2,4,6-trifluoromethylstyrene, hexafluoropropylene oxide, perfluorocyclohexane oxide, tetrafluoroethylene, vinylidine fluoride, chlorotrifluoroethylene, perfluoro(propyl vinyl ether), perfluoro(methyl vinyl ether), 2,2-bis-trifluoromethyl-4,5-difluoro-1,3-dioxole, and mixtures thereof.

57. The process according to claim 53, wherein the polymeric material comprises a silicon-containing polymer.

58. The process according to claim 57, wherein the silicon-containing polymer comprises at least one segment selected from the group consisting of an alkyl siloxane, a fluoroalkyl siloxane, a chloroalkyl siloxane, and mixtures thereof.

59. The process according to claim 53, wherein the metal-containing material comprises at least one metal selected from the group consisting of aluminum, copper, gold, titanium, tantalum, tungsten, molybdenum, silver, and alloys thereof.

60. The process according to claim 53, wherein radiation is selected from the group consisting of visible, ultraviolet, X-ray, and e-beam.

61. The process according to claim 53, wherein radiation is ultraviolet or e-beam and the polymeric material comprises a photo acid generator.

62. The process according to claim 53, wherein the carbon dioxide soluble polymeric material is selected from the group consisting of a copolymer of a fluoroacrylate and a component selected from the group consisting of C(CH$_2$OH)$_3$, a sugar unit, SiR$_3$ wherein R is a polar group selected from the group consisting of:

—CH$_2$CH$_2$CH$_2$OH,

CH$_2$CH$_2$CH$_2$—C≡N, and mixtures thereof.

63. The process according to claim 34, wherein said step of removing the unexposed coating portion from the substrate comprises contacting the unexposed coating portion with a carbon dioxide containing fluid such that the unexposed coating portion is removed from the substrate.

64. The process according to claim 63, wherein said step of contacting the substrate with a first composition comprising carbon dioxide and a component comprises coating the component using a method selected from the group consisting of a spin coating method, a dip coating method, a meniscus coating method, and a spray coating method.

65. The method according to claim 34, wherein the first composition further comprises a co-solvent.

66. The method according to claim 34, further comprising the step of selectively etching the wafer, wherein said step of selectively etching the wafer occurs subsequent to step (c) but prior to step (d).

67. A process of forming integrated circuits comprising the steps of:

(a) inserting at least one wafer into an integrated microelectronics process device (IMPD); then (b) contacting the at least one wafer with a first composition comprising carbon dioxide and a component selected from the group consisting of at least one polymeric material, at least one polymeric precursor, and at least one monomer, and mixtures thereof, to deposit the component on the substrate and form a coating thereon; then (c) imagewise exposing the coating to radiation such that exposed and unexposed coating portions are formed; then (d) subjecting the coating to a second composition comprising carbon dioxide such that either one of the exposed or the unexposed coating portions are removed from the at least one wafer and the other coating portion is developed and remains on the coating to form an image thereon; then (e) depositing a metal-containing material or an ionic material on the surface of the wafer from which the exposed or the unexposed coating portions are removed; then (f) removing the exposed or unexposed coating portion from the substrate; and then (g) removing the at least one wafer from the IMPD;

wherein said steps (a) through (f) are performed in the IMPD without the at least one wafer being removed from the IMPD.

* * * * *